(12) United States Patent
Blodgett

(10) Patent No.: US 6,553,556 B1
(45) Date of Patent: Apr. 22, 2003

(54) PROGRAMMABLE ELEMENT LATCH CIRCUIT

(75) Inventor: Greg A. Blodgett, Nampa, ID (US)

(73) Assignee: Micron Technology, Boise, ID (US)

( * ) Notice: Subject to any disclaimer, the term of this patent is extended or adjusted under 35 U.S.C. 154(b) by 108 days.

(21) Appl. No.: 09/640,741

(22) Filed: Aug. 18, 2000

(51) Int. Cl.⁷ .............................................. G06F 17/50
(52) U.S. Cl. .................................... 716/17; 365/230.03
(58) Field of Search ...................... 716/17, 16; 365/96, 365/200, 204, 100, 230.03

(56) References Cited

U.S. PATENT DOCUMENTS

| | | | | |
|---|---|---|---|---|
| 5,631,862 A | * | 5/1997 | Cutter et al. | 365/189.05 |
| 5,838,624 A | * | 11/1998 | Pilling et al. | 327/525 |
| 5,978,298 A | * | 11/1999 | Zheng | 365/100 |
| 5,999,480 A | * | 12/1999 | Ong et al. | 365/230.03 |
| 6,064,617 A | * | 5/2000 | Ingalls | 365/200 |
| 6,130,834 A | * | 10/2000 | Mullarkey et al. | 365/225.7 |

* cited by examiner

*Primary Examiner*—Matthew Smith
*Assistant Examiner*—Thuan Do

(57) ABSTRACT

An antifuse latch device and method for performing a redundancy pretest without the use of additional test circuitry is disclosed. Conventional antifuse latch devices are designed such that a redundancy pretest cannot be performed on the antifuse latch device once the antifuses are programmed but rather requires additional circuitry to map the appropriate address bits to test the redundant row or column. The present invention adds a level translating inverter to a conventional antifuse latch device, thus allowing the antifuse latch device to simulate an unblown antifuse by isolating the antifuse from the latch.

42 Claims, 3 Drawing Sheets

PROGRAMMABLE ELEMENT LATCH CIRCUIT

BACKGROUND OF THE INVENTION

I. Field of the Invention

The present invention relates generally to a device and method for testing semiconductor electrical devices. In particular, the present invention relates to simulating a programmable state of a device when the device has already been programmed to another programmable state.

II. Description of the Related Art

In order to ensure proper operation, semiconductor devices are typically tested before being packaged into a chip. A series of probes on a test station electrically contact pads on each die to access the semiconductor devices on the die. For example, in a semiconductor memory device, the probes contact address pads and data input/output pads to access selected memory cells in the memory device. Typical dynamic random access memory ("DRAM") devices include one or more arrays of memory cells arranged in rows and columns. Each array of memory cells includes word or row lines that select memory cells along a selected row, and bit or column lines (or pairs of lines) that select individual memory cells along a row to read data from, or write data to, the cells in the selected row.

In a test procedure, predetermined data or voltage values are typically written to selected row and column addresses that correspond to certain memory cells, and then the voltage values are read from those memory cells to determine if the read data matches the data written to those addresses. If the read data does not match the written data, then the memory cells at the selected addresses likely contain defects and the semiconductor device fails the test.

Many semiconductor devices, particularly memory devices, include redundant circuitry on the semiconductor device that can be employed to compensate for certain detected failures. As a result, by enabling such redundant circuitry, the device need not be discarded even if it fails a particular test. For example, memory devices typically employ redundant rows and columns of memory cells so that if a memory cell in a column or row of the primary memory array is defective, then an entire row or column or partial row or column of redundant memory cells can be substituted therefor, respectively.

Substitution of one of the redundant rows or columns is conventionally accomplished by blowing selected antifuses in a bank of antifuse latch devices to select redundant rows or columns to replace defective primary rows or columns. Each bank represents a memory address. If a given primary row or column in the array contains a defective memory cell, antifuses in the bank of antifuses are blown such that the bank of antifuses produces a binary output matching the defective address. An antifuse is a capacitive device that may be blown by applying a relatively high voltage across it which causes the dielectric layer in the antifuse to break down and form a conductive path. A blown antifuse will conduct current while an unblown antifuse will not conduct current. For example, if the defective primary row or column has an 8-bit binary address of 00100100, then the appropriate antifuses in a bank of 8 antifuses are blown to store this address. The individual antifuses are generally contained in antifuse latch devices which generate a digital value or signal indicating whether the antifuse is blown or unblown and may be arranged in groups of 8, each group of 8 defining the address fuses for one antifuse bank.

When an address in the memory device is accessed, a compare circuit compares an incoming address to addresses stored in the antifuse banks to determine whether the incoming address matches an address containing a defective memory cell. If the compare circuit determines such a match, then it outputs a match signal to a row or column decoder. In response, the row or column decoder causes an appropriate redundant row or column to be accessed, and ignores the defective primary row or column in the array.

After antifuses have been programmed to store an address of a defective primary row or column, testing often occurs where it would be beneficial if the antifuse latch device could maintain a state other than that programmed. For example, an antifuse latch device may physically have a blown antifuse, but need to simulate an unblown state to test different configurations of the redundant rows or columns.

Redundant elements are typically tested by assigning a pretest address to each antifuse bank. This pretest address is hard coded so that each memory device has the same redundant pretest address, and the test program is therefore valid for every device. Additional test circuitry is required on the memory device to achieve this hard coding of the pretest addresses. As the number of redundant elements increases, the amount of test circuitry required to define the pretest addresses also increases. For ease of testing, it is desirable to have the ability to test redundant elements using pretest addresses even after the elements have been programmed to repair defective memory elements, e.g. after a repair address has been programmed into the antifuse bank.

Traditionally, in a pretest test mode, the antifuse bank is forced to output a match in response to a pretest address regardless of the state of the antifuse latches. The forced match is accomplished through the use of test circuitry, which bypasses the antifuse latch versus input address compare circuitry, and therefore is not accurate in terms of address to match signal delay. In order to generate the match signal, addresses must be decoded and logically combined with the pretest test mode signal to determine when to force the match. This pretest address decoder increases in size as the number of redundant elements on a memory device increases because more address combinations are required to provide enough unique pretest addresses. Providing sequential pretest addresses require an even larger pretest address decoder since more address terms are required for each bank. For example, in the prior art, it has been sufficient to use just one address term ANDed with the pretest signal to decode a redundant element fuse bank. A0 high would enable bank 0, A1 high would enable bank 1, A2 high would enable bank 2, etc. To avoid enabling multiple fuse banks, only address 0, 2, 4, etc. would be valid using this methodology, and the maximum number of unique fuse bank pretest addresses is limited to the number of address inputs to the device. Current memory devices may require 3 or 4 address terms be ANDed together to generate the required number of pretest addresses. Another drawback of this method is that the tester requires a large memory space for the pretest addresses even though only a few of the addresses are actually valid. Thus, there exits a need for an antifuse latch that can be temporarily programmed for test purposes to a state which is independent of the programmed state and which can ideally be programmed into sequential pretest address states.

SUMMARY OF THE INVENTION

The present invention relates to a device and method for use in memory devices employing redundant rows and/or columns. The present invention provides an antifuse latch device which may perform a redundancy pretest using the real time operational signal path. The circuit of the present invention implements a level translating inverter to control a voltage to the gate of a transistor; the transistor having a source terminal connected to the output of an antifuse. The level translating inverter causes the circuit to simulate an unblown antifuse (or state of other similar programmable elements) by not supplying a voltage sufficient to drive the gate of the transistor receiving a signal from a physically blown antifuse. A blown antifuse can also be simulated by rendering the FA (fuse address) signal high to supply a low signal to the latch, where the physical antifuse is unblown.

Thus, the present invention provides more reliable results for a redundancy pretest, as the speed of signal propagation as well as the functionality of other components in the signal path can be observed during the test mode. The present invention also eliminates the need for some of the circuitry used solely for the redundancy pretest.

The device and method of operation of the invention are also applicable to semiconductor memory devices with other types of programmable elements, i.e. fuses, flash cells, etc., as these elements have similar programmable functionality as an antifuse. For example, a memory device may employ fuses for adjusting the output level of a voltage regulator, or for configuring the device for one of a plurality of device operating modes. Possible operating modes include but are not limited to SDRAM latency, data path width, delay locked loop control for DDR DRAM, etc.

Many other semiconductor devices have fuse options which change the operational characteristics of the device in accordance with the fuses that are blown. Voltage levels, timing delays, input/output configurations, etc. can all be programmed with fuses. The present invention allows for these options to be fully tested without actually blowing the fuses, or adding additional test latches to override the programmed state of the option fuses. Also, the present invention allows for devices with options programmed to be tested as though only a default set of the options had been blown. In this manner, programmed devices which might otherwise be incompatible for parallel testing are again made compatible. For example, parts which are programmed to be 32 Meg×8 can be forced to a 64 Meg×4 input/output configuration using the actual antifuse latch which is programmed to determine the final device configuration.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

Figure 1:
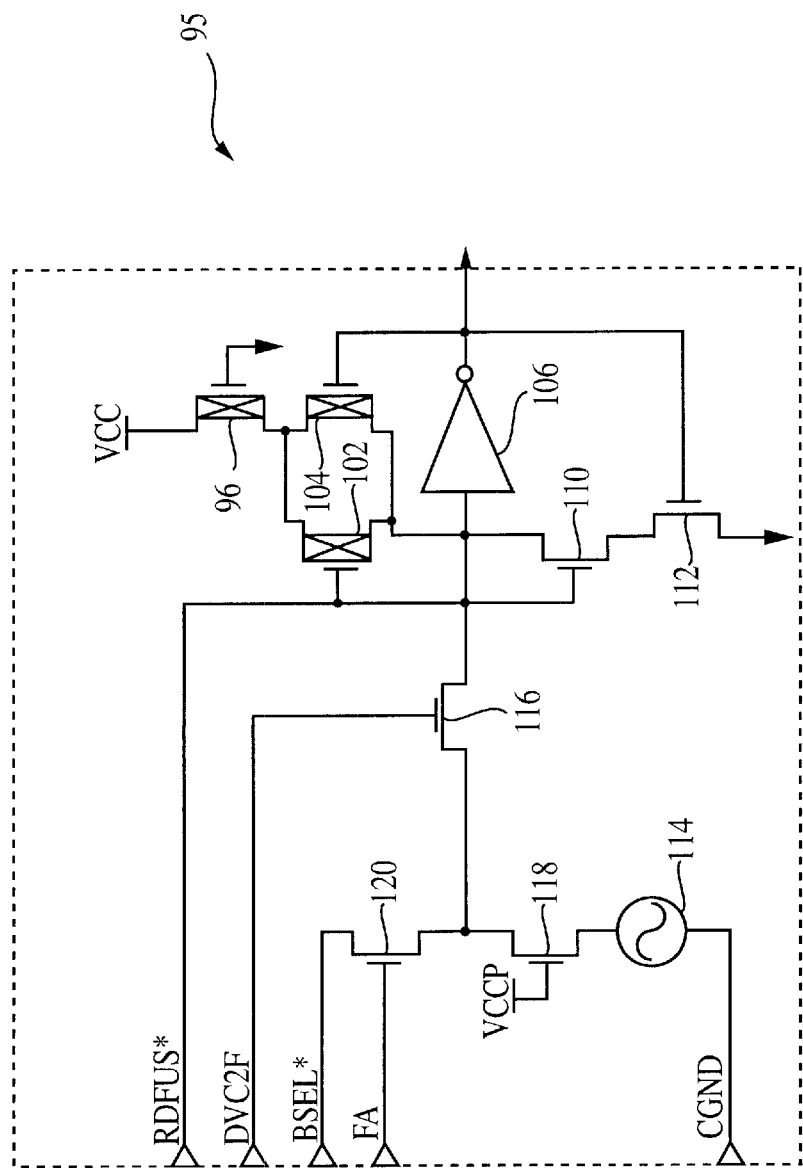
FIG. 1 is an illustration of a conventional antifuse latch device.

Understanding a conventional antifuse latch device used in memory devices, depicted in FIG. 1, is necessary to fully comprehend the present invention, as the present invention improves upon the circuit of FIG. 1. FIG. 1 illustrates a conventional antifuse latch device used in memory devices to determine assignment of redundant rows or columns for addresses having defective primary rows or columns.

The antifuse latch device 95 receives an operating voltage Vcc at a source of a PMOS transistor 96. The PMOS transistor 96 is coupled through two PMOS transistors 102, 104 connected in parallel to an input of an inverter 106. The input of the inverter 106 is coupled to a ground through two NMOS transistors 110, 112 connected in series. This circuitry forms a latch to output a discrete "1" or "0." Gates of the PMOS transistor 102 and the NMOS transistor 110 receive a read fuse signal (RDFUS*). The RDFUS* signal is an active low signal which is normally high to render the PMOS transistor 102 non-conductive and the NMOS transistor 110 conductive. The input of the inverter 106 is also coupled to a first terminal of an antifuse 114 through two NMOS transistors 116, 118. A gate of the NMOS transistor 116 receives a signal DVC2F which is normally slightly greater than one-half Vcc and maintains the NMOS transistor 116 in a conductive state. A gate of the NMOS transistor 118 receives a boosted voltage Vccp (that exceeds Vcc) and maintains the NMOS transistor 118 in a conductive state. A junction between the NMOS transistors 116, 118 receives a bank select signal (BSEL*) through an NMOS transistor 120 having a gate receiving a fuse address signal (FA). A second terminal of the antifuse 114 receives a programming signal CGND which is at ground potential in normal operation.

The antifuse latch device 95 is programmed during manufacture of a memory device after a test to determine which primary rows or columns of addresses in the memory device are defective. Additionally, the redundant rows and columns are tested using a separate circuit only used for testing the redundant elements. Such testing of redundant elements is typically not performed using antifuse latch device 95.

During programming, the BSEL* signal is brought low and the CGND signal is raised to about ten volts. Selected antifuses, such as the antifuse 114, are blown when the fuse address signal (FA) is brought high to render the NMOS transistor 120 conductive to allow current to flow through the antifuse 114 and the NMOS transistors 118, 120. The current breaks down the dielectric layer in the antifuse 114. If the antifuse 114 is to remain unblown the FA signal is kept low such that the NMOS transistor 120 prevents current from flowing through the antifuse 114. The signals BSEL*, FA, and CGND are used only during the manufacture of the memory device to program antifuse circuits. During operation of the memory device, the fuse add signal FA is held low to render the NMOS transistor 120 non-conductive, and the common ground signal CGND is coupled to ground through a transistor (not shown).

The antifuse latch device 95 indicates whether the antifuse 114 is blown or unblown with an output signal at an output of the inverter 106. The antifuse circuit 95 is read by an active low pulse in the RDFUS* output signal to generate the signal. When the RDFUS* signal is brought low, the PMOS transistor 102 is rendered conductive to couple Vcc to the first terminal of the antifuse 114 through the transistors 96, 102, 116, 118. If the antifuse 114 is unblown and thus remains non-conductive, the antifuse 114 is charged. The voltage at the input of the inverter 106 is allowed to rise with the voltage on the terminal of the antifuse 118 because the NMOS transistors 116, 118 are ON. When the voltage rises above a threshold voltage of the inverter 106, the inverter 106 outputs a low signal to indicate that the antifuse 114 is unblown. Gates of the PMOS transistor 104 and the NMOS transistor 112 are connected to the output of the inverter 106 so that the transistor 104 latches the signal at the output of the inverter 106 and the transistor 112 is switched OFF when the RDFUS* signal is brought high at the end of its pulse to turn ON the transistor 110.

If the antifuse 114 is blown such that it conducts current, then the input of the inverter 106 is held at substantially zero volts despite Vcc being applied to the input of the inverter 106 through the PMOS transistors 96, 102. When the RDFUS* signal is brought high, the input of the inverter 106 will remain low and its output will be high. As a result, the PMOS transistor 104 is turned OFF and the NMOS transistor 112 is turned ON to latch the output of the inverter 106 high. The signal at the output of the inverter 106 thereby indicates the state of the antifuse 114 and provides one digit of an address of a defective row or column.

While the above operation of antifuse latch device 95 illustrates how the antifuse circuit 95 is programmed, antifuse latch device 95 may not be used for a redundancy pretest once the antifuse is programmed because the pretest address will generally not match the programmed address and is not practical to alter the pretest addresses for each device being tested. Antifuse latch device 95 has no method to simulate an unblown antifuse where antifuse latch device 95 physically contains a blown antifuse 114.

Figure 2:
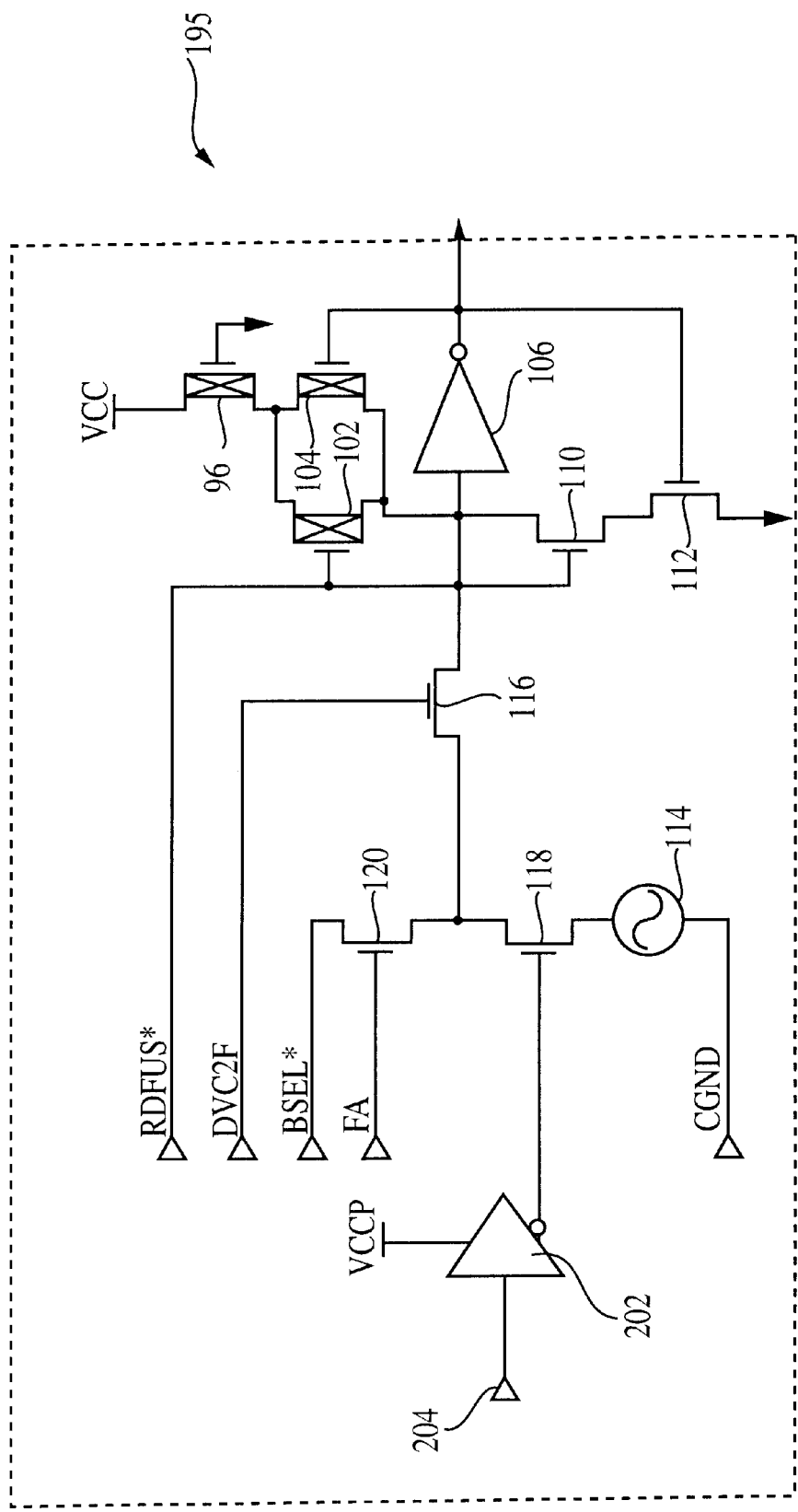
FIG. 2 is an illustration of an improved antifuse latch device in accordance with an exemplary embodiment of the present invention.

The present invention provides a modification to the antifuse latch device of FIG. 1 to allow a redundancy pretest before or after antifuses 114 have been programmed by providing for the simulation of an unblown or blown antifuse using the same circuitry that will be used in the actual operation of the memory device. FIG. 2 illustrates an exemplary embodiment of the present invention. Antifuse latch device 195 includes a level translating inverter 202 having an output connected to the gate of NMOS transistor 118. The level translating inverter 202 passes Vccp to the gate of NMOS transistor 118 when its input 204 is a low signal and passes ground to the gate of NMOS transistor 118 when its input 204 is high.

In operation, the state of the antifuse 114 can be simulated during a pretest after antifuse 114 had been programmed. By sending a high signal level to input 204 of the level translating inverter 202 and driving the RDFUS* signal low, where all antifuse latch devices 195 have a common level translating inverter 202 circuit and a common RDFUS*, NMOS transistor 118 is shut off and antifuse 114 is isolated from the latch formed by inverter 106 and transistors 96, 104, 110, and 112. Then, by driving BSEL* low, where BSEL* is common for all antifuse latch devices 195, and by driving FA high for particular antifuse latch devices 195, to selectively program targeted antifuse latch devices 195, a blown state is simulated. Thereafter, RDFUS* is driven high.

A blown antifuse is simulated because with BSEL* low and FA high, a low value is passed through NMOS transistors 120 and 116 to the input of inverter 106 overriding the logic high at the input of 106 because the drive strength of the series NMOS transistors 120 and 116 is greater than the drive strength of the PMOS transistors 96 and 104. Similarly, an antifuse latch device 195 will simulate an unblown antifuse if FA is never driven high.

Even after all FA are driven back low, the antifuse latch device 195 will retain the desired programmed state as long as the fuse read signal RDFUS* is held high. For an entire bank of antifuse latch devices 195, where the bank has a common level translating inverter 202, a common bank select signal BSEL* and individual FA lines per antifuse latch device 195, the entire bank can be cleared and then programmed in one cycle by driving the appropriate FA lines high with BSEL* low. In this manner, banks of redundant elements can be assigned sequential pretest address without the need of a pretest address decoder. Also, most of the fuse latch as well as the address comparator can be used in the redundant element pretest sequence providing identical timing to the normal operation of the memory device. Once testing is completed, the antifuse latch device 195 may resume its programmed state by driving input 204 low, which renders NMOS transistor 118 conductive, no longer isolating the antifuse 114.

Typically, each redundant element antifuse bank will also have an enable fuse to enable that particular bank to be active. The present invention allows for the enable fuses to be individually programmed regardless of the programmed state of the enable antifuse. For example, all enable fuses can be cleared to the unblown state allowing the device to be tested as though no repair had been done.

Figure 3:
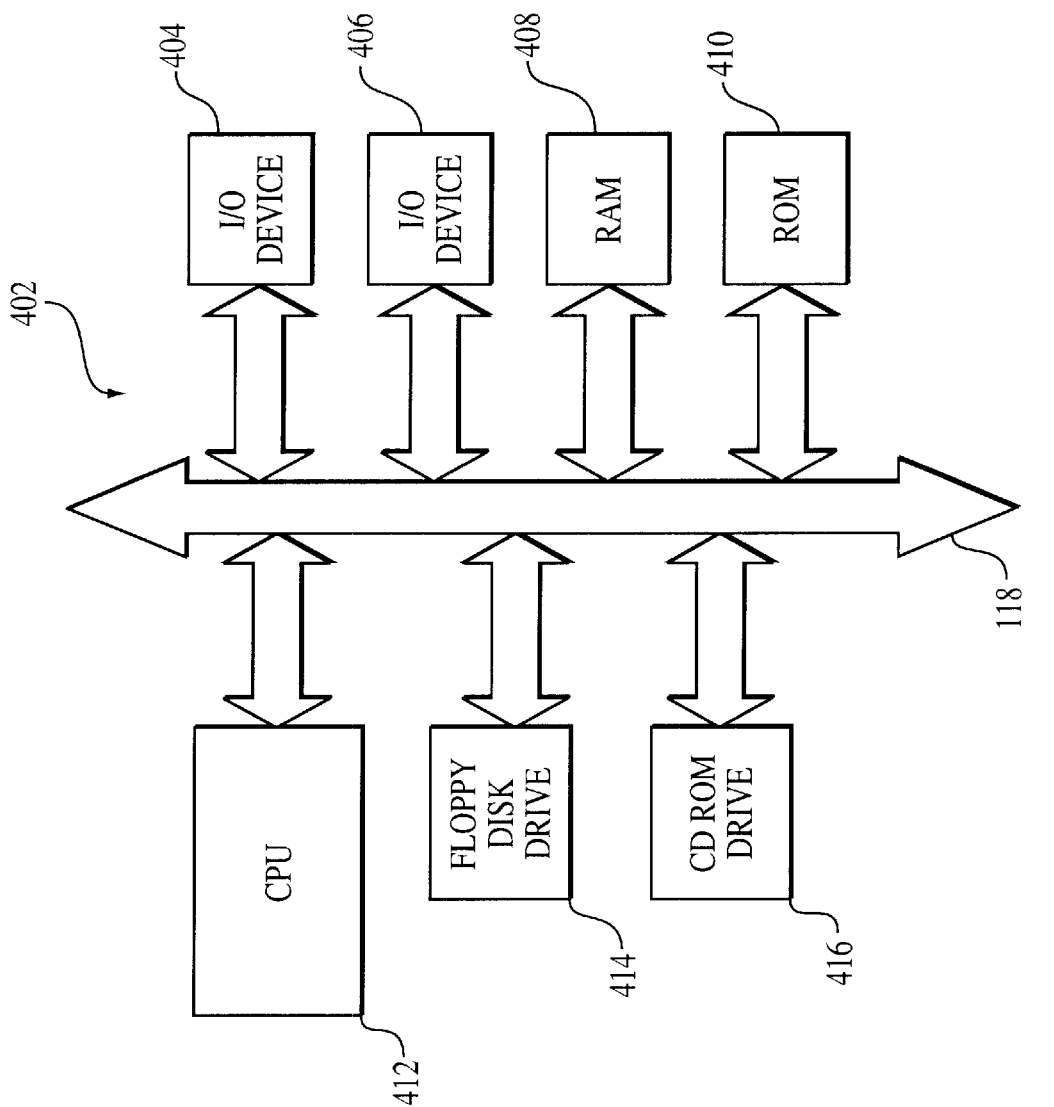
FIG. 3 illustrates a processor system employing a memory device containing the antifuse latch device of FIG. 2.

FIG. 3, illustrates a simplified processor system 402 which may employ memory devices containing the redundant row/column pretest method and circuitry of the present invention. Processor system 402 includes central processing unit (CPU) 412, RAM and ROM memory devices 408, 410, input/output (I/O) devices 404, 406, floppy disk drive 414 and CD ROM drive 416. All of the above components communicate with each other over bus 418. The RAM memory device 408 may use the FIG. 2 antifuse latch device 195 for programming, testing and real time operation of redundant rows or columns. RAM 408 and CPU 412 may also be integrated together on a single chip.

It is to be understood that the above description is intended to be illustrative and not restrictive. Many variations to the above-described device and method will be readily apparent to those having ordinary skill in the art. For example, as mentioned above, the above device and method may be employed with any type of programmable element, such as a fuse or flash cell, etc., where one or more programmed states must be simulated for testing. The type of logic implemented will vary based upon the type of programmable element used.

For the purposes of this disclosure, antifuse, laser fuse, electrical fuse, etc. are interchangeable terms. For example, a fuse latch used in conjunction with laser fuses can be modified in accordance with the teachings of the present invention to accomplish the benefits of the invention for an antifuse latch.

Accordingly, the present invention is not to be considered as limited by the specifics of the particular device and method which have been described and illustrated, but is only limited by the scope of the appended claims.

What is claimed as new and desired to be protected by Letters Patent of the United States is:

1. An programmable device, said device comprising:
   a programmable element;
   a latch for reading and holding a logic state of said programmable element; and
   a circuit coupled to said programmable element for simulating a programmed logic state of said programmable element, regardless of the actual programmed logic state of said programmable element.

2. The programmable device of claim 1, wherein said programmable element comprises an antifuse.

3. The programmable device of claim 1, wherein said programmable element comprises a fuse.

4. The programmable device of claim 1, wherein said programmable element comprises a flash cell.

5. The programmable device of claim 1, wherein said circuit for simulating said programmed logic state of said programmable element comprises an inverter controlling the supply of a gate voltage to a gate of a transistor, said transistor having a source terminal coupled to said programmable element.

6. The programmable device of claim 5, wherein said simulated programmed logic state is a state corresponding to an unblown antifuse.

7. The programmable device of claim 5, wherein said simulated programmed logic state is a state corresponding to a blown antifuse.

8. The programmable device of claim 5, wherein said inverter is a level translating inverter.

9. The programmable device of claim 5 further comprising a voltage signal source, said voltage signal source supplying input to said inverter with a high voltage signal.

10. The programmable device of claim 1 further comprising a compare circuit receiving an output of said latch to activate a redundant row or column in a memory device for an address in said memory device containing a defective row or column in a primary array of said memory device.

11. An antifuse circuit comprising:
an antifuse coupled to a source terminal of a first transistor; and
an inverter coupled to a gate of said first transistor, said inverter selectively providing a signal to said first transistor to isolate said antifuse from a latch coupled to a drain of said first transistor; said latch receiving a signal for simulating a programmed logic state of said antifuse.

12. The antifuse circuit of claim 11, wherein said inverter is a level translating inverter.

13. The antifuse circuit of claim 11 further comprising a second transistor coupled to said first transistor at a node, said second transistor receiving and supplying said signal for simulating said programmed logic state.

14. The antifuse circuit of claim 11, wherein said simulated programmed logic state is a state corresponding to an unblown antifuse.

15. The antifuse circuit of claim 11 further comprising a third transistor coupled to said node; said third transistor receiving a voltage signal from said node and supplying said signal for simulating a programmed logic state of said antifuse to said latch.

16. The antifuse circuit of claim 11 further comprising a compare circuit receiving the output of said latch to activate a redundant row or column in a memory device for an address in said memory device containing a defective row or column in a primary array of said memory device.

17. A processor system comprising:
a processor; and
a memory device coupled to said processor, said memory device containing at least one programmable device, said at least one programmable device comprising:
a programmable element;
a latch for reading and holding a logic state of said programmable element; and
a circuit coupled to said programmable element for simulating a programmed logic state of said programmable element, regardless of the actual programmed logic state of said programmable element.

18. The system of claim 17, wherein said programmable element comprises an antifuse.

19. The system of claim 17, wherein said programmable element comprises a fuse.

20. The system of claim 17, wherein said programmable element comprises a flash cell.

21. The system of claim 17, wherein said circuit for simulating said programmed logic state of said programmable element comprises an inverter controlling the supply of a gate voltage to a gate of a transistor, said transistor having a source terminal coupled to said programmable element.

22. The system of claim 21, wherein said simulated programmed logic state is a state corresponding to an unblown antifuse.

23. The system of claim 21, wherein said simulated programmed logic state is a state corresponding to a blown antifuse.

24. The system of claim 21, wherein said inverter is a level translating inverter.

25. The system of claim 21 further comprising a voltage signal source, said voltage signal source supplying input to said inverter with a high voltage signal.

26. The system of claim 17 further comprising a compare circuit receiving an output of said latch to activate a redundant row or column in a memory device for an address in said memory device containing a defective row or column in a primary array of said memory device.

27. An integrated memory circuit comprising:
a die containing a processor and memory device, said memory device containing at least one programmable device for selecting a redundant memory cell or column, said at least one programmable device comprising:
a programmable element;
a latch for reading and holding a logic state of said programmable element; and
a circuit coupled to said programmable element for simulating a programmed logic state of said programmable element, regardless of the actual programmed logic state of said programmable element.

28. The circuit of claim 27, wherein said programmable element comprises an antifuse.

29. The circuit of claim 27, wherein said programmable element comprises a fuse.

30. The circuit of claim 27, wherein said programmable element comprises a flash cell.

31. The circuit of claim 27, wherein said circuit for simulating said programmed logic state of said programmable element comprises an inverter controlling the supply of a gate voltage to a gate of a transistor, said transistor having a source terminal coupled to said programmable element.

32. The circuit of claim 31, wherein said simulated programmed logic state is a state corresponding to an unblown antifuse.

33. The circuit of claim 31, wherein said simulated programmed logic state is a state corresponding to a blown antifuse.

34. The circuit of claim 31, wherein said inverter is a level translating inverter.

35. The circuit of claim 31 further comprising a voltage signal source, said voltage signal source supplying input to said inverter with a high voltage signal.

36. The circuit of claim 27 further comprising a compare circuit receiving an output of said latch to activate a redundant row or column in a memory device for an address in said memory device containing a defective row or column in a primary array of said memory device.

37. A method of simulating a programmed logic state of a programmable element, said method comprising:
applying a first signal to an inverter to isolate said programmable element from a latch circuit;
supplying a second signal to simulate a programmed logic state of said programmable element, regardless of the actual programmed logic state of said programmable element; and receiving said second signal for simulating said programmed logic state of said programmable element in said latch circuit to maintain said simulated programmed logic state.

38. The method of claim 37, wherein said first signal is a high signal applied to said inverter.

39. A method of simulating an unblown antifuse in an antifuse latch device having a blown antifuse, said method comprising:

applying a signal to an inverter;

supplying a voltage in response to said signal to a gate of a transistor having a source terminal coupled to said antifuse in said antifuse latch device to simulate an unblown antifuse; and maintaining said simulation of a unblown antifuse by use of a latch circuit.

40. The method of claim 39, wherein said signal is a high signal applied to said inverter.

41. The method of claim 39, where said voltage passed to said gate of said transistor is a not sufficient to drive a signal at said source terminal of said transistor through said transistor.

42. The method of claim 39 further comprising outputting a signal from said latch circuit representing a bit in an address of a defective primary row or column in order to substitute said defective primary row or column with a redundant row or column.

* * * * *

UNITED STATES PATENT AND TRADEMARK OFFICE
CERTIFICATE OF CORRECTION

PATENT NO.    : 6,553,556 B1
DATED         : April 22, 2003
INVENTOR(S)   : Greg A. Blodgett It is certified that error appears in the above-identified patent and that said Letters Patent is hereby corrected as shown below:

<u>Drawings,</u>
Sheet 1 of 3, after the legend "FIG.1" add -- Prior Art --

Signed and Sealed this

Twenty-third Day of March, 2004

JON W. DUDAS
*Acting Director of the United States Patent and Trademark Office*